United States Patent
Watford

(10) Patent No.: US 9,818,567 B1
(45) Date of Patent: Nov. 14, 2017

(54) APPARATUS AND METHOD OF REDUCING ARCING BETWEEN A CIRCUIT BREAKER LINE TERMINAL AND A PANEL BOARD TERMINAL

(71) Applicant: Siemens Industry, Inc., Alpharetta, GA (US)

(72) Inventor: Russell Thomas Watford, Lawrenceville, GA (US)

(73) Assignee: Siemens Industry, Inc., Alpharetta, GA (US)

( * ) Notice: Subject to any disclaimer, the term of this patent is extended or adjusted under 35 U.S.C. 154(b) by 0 days.

(21) Appl. No.: 15/245,628

(22) Filed: Aug. 24, 2016

(51) Int. Cl.
*H01H 71/12* (2006.01)
*H05K 5/02* (2006.01)

(52) U.S. Cl.
CPC ........ *H01H 71/128* (2013.01); *H01H 71/126* (2013.01); *H05K 5/0217* (2013.01)

(58) Field of Classification Search
CPC ... H01H 71/128; H01H 71/126; H05K 5/0217
USPC ............ 200/325, 43.16, 43.14, 43.15, 43.01; 335/6
See application file for complete search history.

(56) References Cited

U.S. PATENT DOCUMENTS

| 7,679,478 B2 * | 3/2010 | McCoy | H01H 71/04 335/10 |
| 9,048,054 B2 * | 6/2015 | Potratz | H01H 83/02 |
| 9,564,280 B2 * | 2/2017 | Mittlestadt | H01H 71/126 |

* cited by examiner

*Primary Examiner* — Edwin A. Leon

(57) ABSTRACT

An apparatus and a method are provided to reduce arcing between a circuit breaker having a breaker line terminal and a panel board terminal of an electrical panel board during installation and/or removal. The apparatus has an auto tripping mechanism including an auto trip lever having an end and a spring disposed at or near the end of the auto trip lever. The auto trip lever is configured to interface with an armature in a module one that houses a cradle of a breaker mechanism. The breaker mechanism is prevented from latching until the circuit breaker has been installed in the electrical panel board by keeping a breaker handle in a tripped position when the breaker line terminal and the panel board terminal are connected. The spring is configured to force the auto trip lever to rotate for providing a force and a deflection to automatically trip the circuit breaker as the circuit breaker is being removed from the electrical panel board and before the breaker line terminal and the panel board terminal separate.

20 Claims, 8 Drawing Sheets

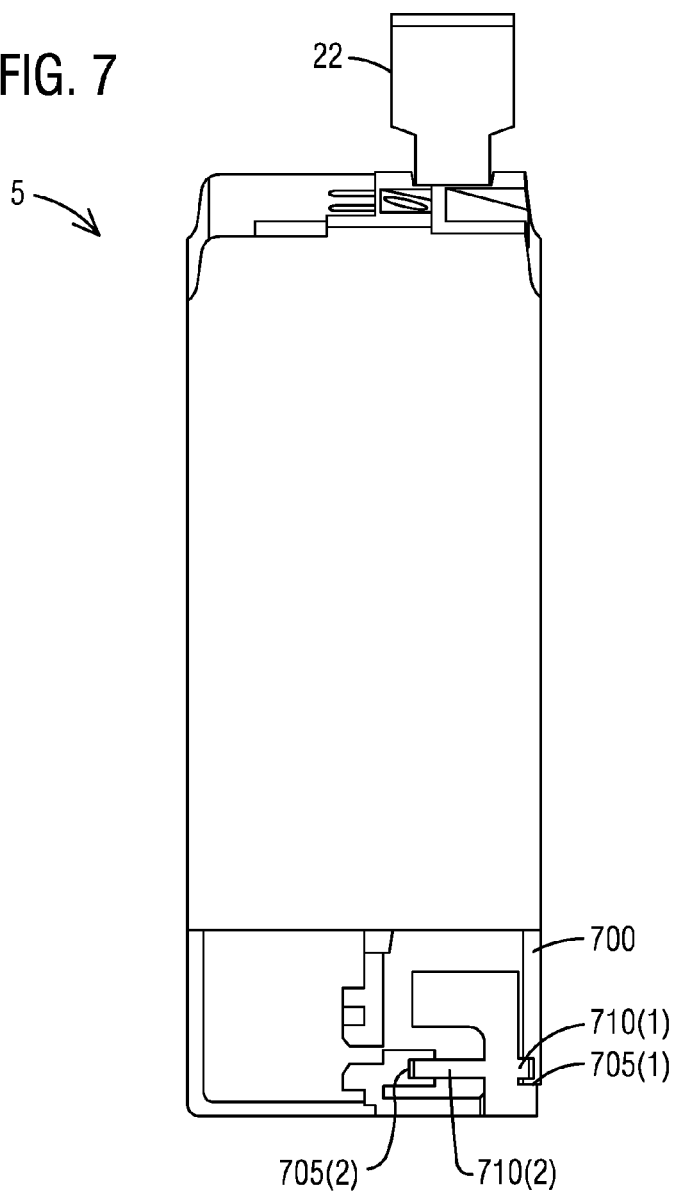
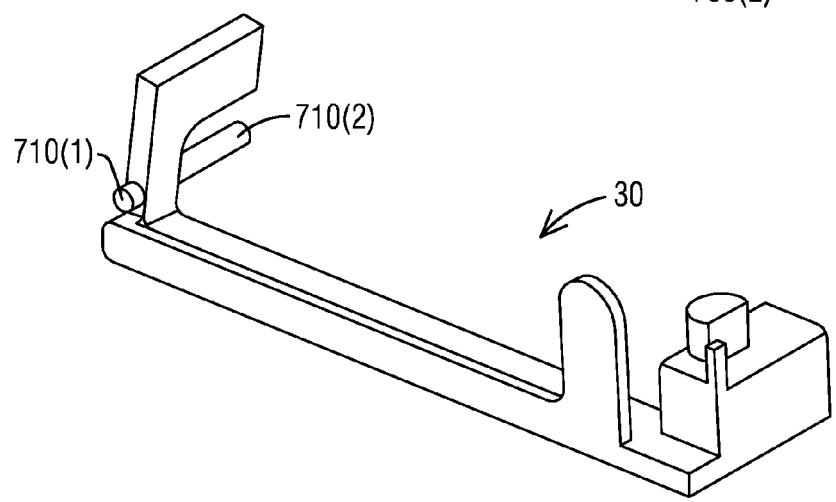

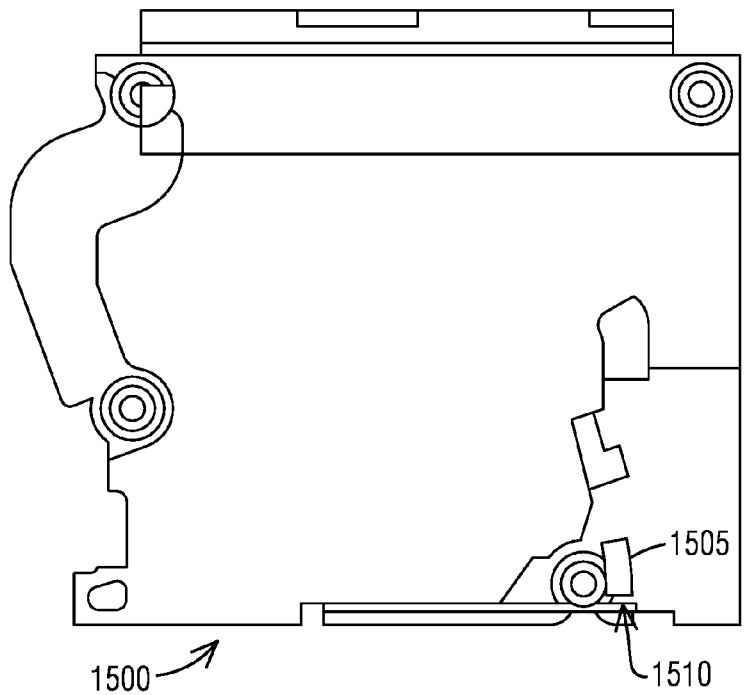

Provide an auto trip lever having an end, wherein the auto trip lever is configured to interface with an armature in a module one that houses a cradle of a breaker mechanism Prevent the breaker mechanism from latching until the circuit breaker has been installed in the electrical panel board by keeping a breaker handle in a tripped position when the breaker line terminal and the panel board terminal are connected Provide a spring at or near the end of the auto trip lever, wherein the spring is configured to force the auto trip lever to rotate Provide a force and a deflection by the spring to automatically trip the circuit breaker as the circuit breaker is being removed from the electrical panel board and before the breaker line terminal and the panel board terminal separate

APPARATUS AND METHOD OF REDUCING ARCING BETWEEN A CIRCUIT BREAKER LINE TERMINAL AND A PANEL BOARD TERMINAL

BACKGROUND

1. Field

Aspects of the present invention generally relate to a breaker mechanism of a circuit breaker and more specifically relates to an auto tripping mechanism for reducing arcing between a circuit breaker having a breaker line terminal and a panel board terminal of an electrical panel board during installation and/or removal of the circuit breaker.

2. Description of the Related Art

Electrical circuit branches of single-phase AC power systems typically use electrical cables that include a line conductor and a neutral conductor coupled between a source and a load, with the neutral conductor grounded at the source. Ground fault circuit interrupt ("GFCI") devices are installed in such circuit branches to interrupt power upon detection of ground current faults from the line conductor to ground at the load, as well as grounded neutral faults (e.g., low impedance connection faults) between the neutral conductor and ground at the load. Electrical arcs can develop temperatures well above the ignition level of most common flammable materials and, therefore, pose a significant fire hazard. Two types of dangerous arcing that are likely to occur in the home are momentary, high-energy arcs caused by high-current faults and persistent, low-current "contact" arcing. As such, the maximum current in the arc is limited to the load current and, therefore, may be substantially below the over-current or "trip" rating of an associated circuit breaker. Arc fault circuit interrupt ("AFCI") devices are used in circuit breakers which are installed to prevent dangerous conditions due to high-energy arcs and contact arcing.

A circuit breaker may be constructed by pairing two single pole circuit interrupters into one construction. A two-pole circuit breaker could be a traditional circuit interrupter or an electronic circuit interrupter that detects ground faults and/or arc faults as well as over current conditions of equipment electrically coupled as a load to the two-pole circuit breaker.

In residential circuit breakers, a concern is electrical execution to a person if a circuit breaker is installed and/or removed from the home panel while power is still on. When a residential circuit breaker is installed and/or removed from a live panel board and the circuit breaker is in the ON position, arcing can occur between the line terminal of the circuit breaker and the panel board line stab. While it may be obvious that power should be turned off when working with electrical equipment, this may be ignored or forgotten by the user.

Therefore, there is a need for an improved residential electronic circuit breaker that reduces the risk of arcing between the breaker and panel terminals during installation and removal processes.

SUMMARY

Briefly described, aspects of the present invention relate to circuit breakers such as residential electronic circuit breakers that provide a means to prevent the main contacts of the circuit breaker to mate during installation and to open the main contacts when the circuit breaker is being removed from an electrical panel board. In particular, embodiments of the present invention remedy a dangerous condition involving arcing by preventing a breaker mechanism from latching until the circuit breaker has been installed in an electrical panel board and the circuit breaker is automatically tripped as the circuit breaker is being removed from the panel and before the breaker terminal and the panel terminal separate. One of ordinary skill in the art appreciates that such a safety system can be configured to be installed in different environments where such protection is needed, for example, in GFCI and AFCI circuit breakers.

In accordance with one illustrative embodiment of the present invention, an apparatus is provided to reduce arcing between a circuit breaker having a breaker line terminal and a panel board terminal of an electrical panel board during installation and/or removal. The apparatus comprises an auto tripping mechanism including an auto trip lever having an end and a spring disposed at or near the end of the auto trip lever. The auto trip lever is configured to interface with an armature in a module one that houses a cradle of a breaker mechanism. The breaker mechanism is prevented from latching until the circuit breaker has been installed in the electrical panel board by keeping a breaker handle in a tripped position when the breaker line terminal and the panel board terminal are connected. The spring is configured to force the auto trip lever to rotate for providing a force and a deflection to automatically trip the circuit breaker as the circuit breaker is being removed from the electrical panel board and before the breaker line terminal and the panel board terminal separate.

In accordance with another illustrative embodiment of the present invention, a circuit breaker having first and second modules is provided. The first module comprises a breaker mechanism including: a moveable arm contact, a stationary contact, a breaker line terminal, a breaker handle, an armature, and a cradle. The first module further comprises an auto tripping mechanism to reduce arcing between the breaker line terminal and a panel board terminal of an electrical panel board during installation and/or removal of the circuit breaker. The auto tripping mechanism including an auto trip lever having an end and a spring disposed at or near the end of the auto trip lever. The auto trip lever is configured to interface with an armature in a module one that houses a cradle of a breaker mechanism. The breaker mechanism is prevented from latching until the circuit breaker has been installed in the electrical panel board by keeping a breaker handle in a tripped position when the breaker line terminal and the panel board terminal are connected. The spring is configured to force the auto trip lever to rotate for providing a force and a deflection to automatically trip the circuit breaker as the circuit breaker is being removed from the electrical panel board and before the breaker line terminal and the panel board terminal separate.

In accordance with yet another illustrative embodiment of the present invention, a method of reducing arcing between a breaker line terminal and a panel board terminal of an electrical panel board during installation and/or removal of a circuit breaker is provided. The method comprises providing an auto trip lever having an end, wherein the auto trip lever is configured to interface with an armature in a module one that houses a cradle of a breaker mechanism, preventing the breaker mechanism from latching until the circuit breaker has been installed in the electrical panel board by keeping a breaker handle in a tripped position when the breaker line terminal and the panel board terminal are connected, providing a spring at or near the end of the auto trip lever, wherein the spring is configured to force the auto trip lever to rotate and providing a force and a deflection by the spring to automatically trip the circuit breaker as the circuit breaker is being removed from the electrical panel board and before the breaker line terminal and the panel board terminal separate.

BRIEF DESCRIPTION OF THE DRAWINGS

FIG. 7 illustrates an orthographic view of an auto trip lever pivot and the surrounding structure in accordance with one illustrative embodiment of the present invention.

FIGS. 8-9 illustrate orthographic views of the auto trip lever in accordance with one illustrative embodiment of the present invention.

FIG. 15 illustrates a side view of a Module one base of the circuit breaker shown in FIG. 1 in accordance with one illustrative embodiment of the present invention.

FIG. 16 illustrates a flow chart of a method of reducing arcing between a circuit breaker line terminal and an electrical panel board terminal during installation and/or removal of the circuit breaker in accordance with an exemplary embodiment of the present invention.

DETAILED DESCRIPTION

To facilitate an understanding of embodiments, principles, and features of the present invention, they are explained hereinafter with reference to implementation in illustrative embodiments. In particular, they are described in the context of an auto tripping mechanism for reducing arcing between a circuit breaker line terminal and an electrical panel board terminal during installation and/or removal of the circuit breaker. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

A system is provided for reducing arcing between a circuit breaker line terminal and an electrical panel board terminal during installation and/or removal of a circuit breaker such as a single-pole or multi-pole GFCI or AFCI circuit breaker or Combination Type Arc Fault Circuit Interrupters (CAFCI). An auto tripping mechanism comprises an auto trip lever having an end. The auto trip lever is configured to interface with an armature in a module one that houses a cradle of a breaker mechanism. The breaker mechanism is prevented from latching until the circuit breaker has been installed in the electrical panel board by keeping a breaker handle in a tripped position when the breaker line terminal and the panel board terminal are connected. The locking mechanism further comprises a spring disposed at or near the end of the auto trip lever and configured to force the auto trip lever to rotate for providing a force and a deflection to automatically trip the circuit breaker as the circuit breaker is being removed from the electrical panel board and before the breaker line terminal and the panel board terminal separate. Accordingly, a condition that could be hazardous may be avoided. A user who is working with the circuit breaker would be safe. In this way, a safety feature is provided for circuit breakers such as a single-pole and a multi-pole GFCI or AFCI or CAFCI circuit breaker.

Figure 1:
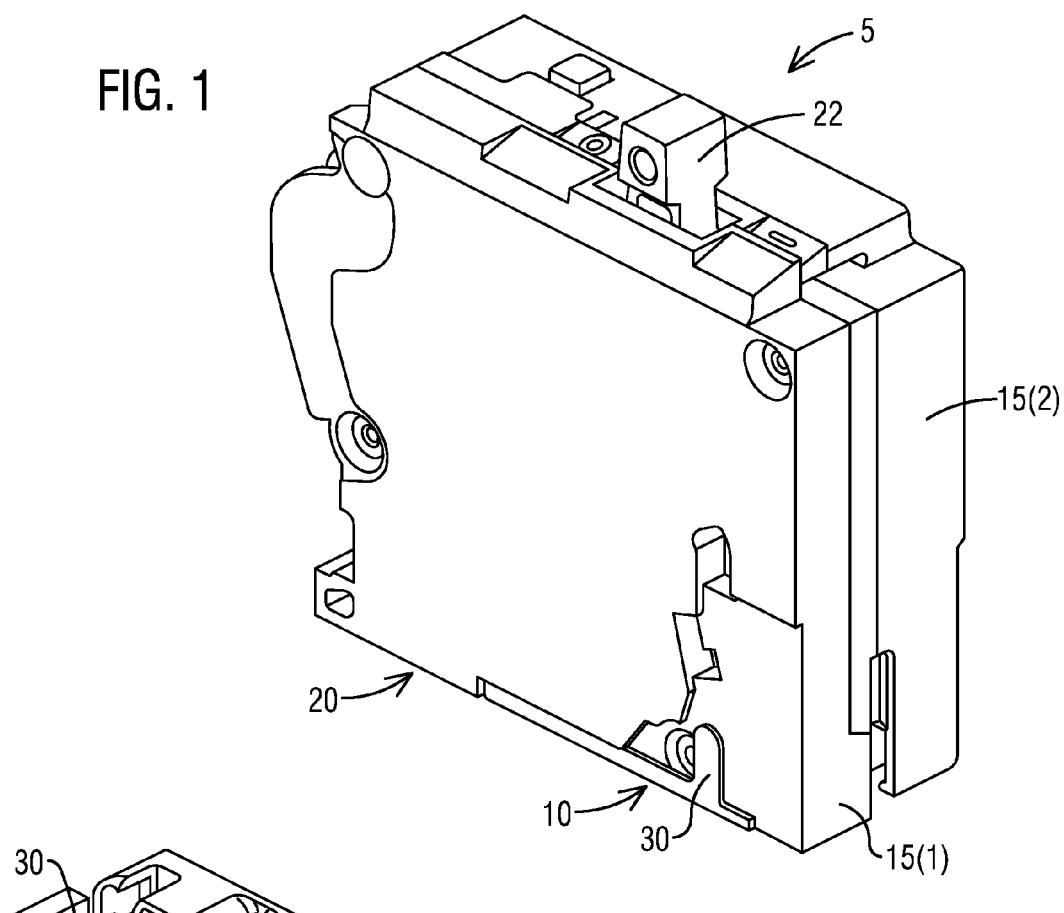
FIG. 1 illustrates an isometric view of an electronic single-pole circuit breaker including an auto tripping mechanism for reducing arcing between a circuit breaker line terminal and an electrical panel board terminal during installation and/or removal of the circuit breaker in accordance with one illustrative embodiment of the present invention.

FIG. 1 illustrates an isometric view of a single-pole circuit breaker 5 including an auto tripping mechanism 10 for reducing arcing between a circuit breaker line terminal and an electrical panel board terminal during installation and/or removal of the single-pole circuit breaker 5 in accordance with one illustrative embodiment of the present invention. The single-pole circuit breaker 5 comprises first and second modules 15(1-2). The first module 15(1) is a mechanical module and the second module 15(2) is an electronic module. The first module 15(1) includes typical components including a breaker mechanism 20 that includes a moveable arm contact, a stationary contact, a breaker line terminal, a breaker handle 22, an armature and a cradle. The breaker mechanism 20 will close a moveable arm and a contact when the breaker handle 22 is rotated clockwise to a Fully ON position. The first module 15(1) further includes springs, a base and a cover.

Consistent with one embodiment, the first module 15(1) includes necessary mechanisms that will close a main pair of contacts when the breaker handle 22 is rotated to the Fully ON position. The second module 15(2) includes a circuit breaker stationary line terminal, a stationary contact terminal and a contact. These are typical mechanical components of a residential circuit breaker.

The single-pole circuit breaker 5 includes the auto tripping mechanism 10 that comprises an auto trip lever 30 and a spring such as a compression spring (not shown, see component 515 in FIGS. 5 and 6) that is located in the first module 15(1). Both the auto trip lever 30 and the compression spring are located toward a lower portion of the single-pole circuit breaker 5 such as a residential circuit breaker. The auto tripping mechanism 10 is configured to prevent the main contacts of the single-pole circuit breaker 5 to mate during installation and to open the main contacts when the single-pole circuit breaker 5 is being removed from an electrical panel board.

In particular, the auto tripping mechanism 10 prevents the breaker mechanism 20 from latching until the single-pole circuit breaker 5 has been installed in the electrical panel board and the single-pole circuit breaker 5 is automatically tripped as the single-pole circuit breaker 5 is being removed from the electrical panel board and before a breaker terminal and a panel terminal separate. The breaker mechanism 20 is prevented from latching by keeping the breaker handle 22 in a tripped position when the breaker line terminal and the panel board terminal are connected. The breaker mechanism 20 will close a moveable arm and a contact when the breaker handle 22 is rotated clockwise to a Fully ON position. Accordingly, the auto tripping mechanism 10 prevents a dangerous situation with the single-pole circuit breaker 5.

The compression spring is disposed at or near the end of the auto trip lever 30 and configured to force the auto trip lever 30 to rotate for providing a force and a deflection to automatically trip the single-pole circuit breaker 5 as the single-pole circuit breaker 5 is being removed from the electrical panel board and before the breaker line terminal and the panel board terminal separate. The auto tripping mechanism 10 to open the main contacts when the single-pole circuit breaker 5 is being removed from the electrical panel board. Accordingly, the auto tripping mechanism 10 prevents a dangerous situation with the single-pole circuit breaker 5.

As used herein, the "single-pole circuit breaker" refers to a single-pole or a multi-pole circuit breaker, as described herein that corresponds to an automatically operated electrical switch designed to protect an electrical circuit from damage caused by overload or short circuit. Its basic function is to detect a fault condition and interrupt current flow. The "single-pole or a multi-pole circuit breaker," in addition to the exemplary hardware description above, refers to a device that is configured to reset (either manually or automatically) to resume normal operation. The "single-pole or a multi-pole circuit breaker," may be used to protect an individual household appliance up to a large switchgear designed to protect high voltage circuits, and operated by a controller. It should be appreciated that several other components may be included in the "single-pole or a multi-pole circuit breaker." However, the function and use of such equipment for a circuit breaker application are well known in the art and are not discussed further. The "single-pole or a multi-pole circuit breaker," may be capable of operating based on its features such as voltage class, construction type, interrupting type, and structural features.

Consistent with one embodiment, the single-pole circuit breaker 5 comprises an assembly of the first and second modules 15(1-2). The first module 15(1) includes the auto tripping mechanism 10 that comprises the auto trip lever 30 and the compression spring (see FIGS. 5 and 6). It will be appreciated by those skilled in the pertinent art that various arrangements and/or modifications may be incorporated in a circuit breaker of choice to perform this safety feature. Although an electronic single-pole circuit breaker 5 is pictorially shown in FIG. 1, minor modifications may be made to incorporate the auto tripping mechanism 10 into a two-pole residential electronic circuit breaker and/or one and two-pole standard thermal magnetic residential circuit breakers.

Figure 2:
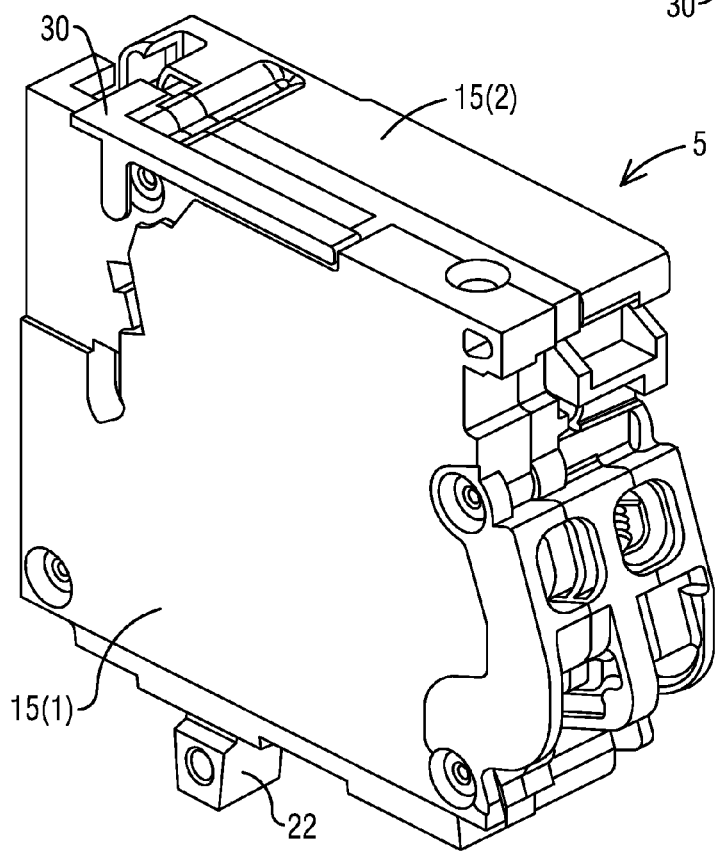
FIG. 2 illustrates an isometric view of the electronic single-pole circuit breaker of FIG. 1 in an upside down orientation in accordance with one illustrative embodiment of the present invention.
Figure 3:
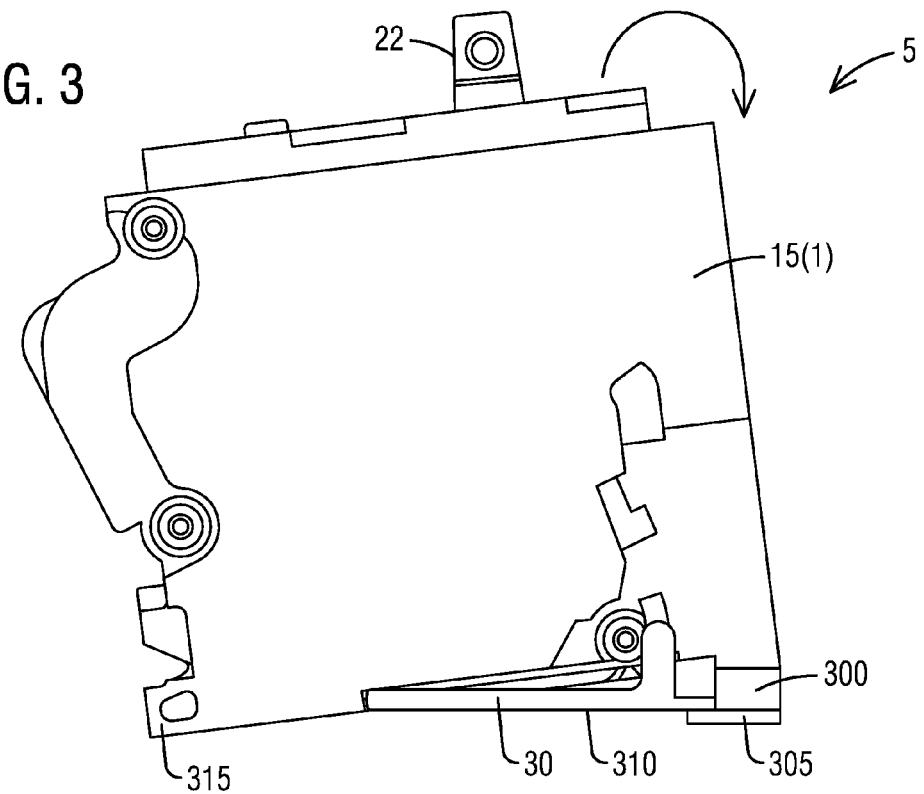
FIG. 3 illustrates a side view of the circuit breaker of FIG. 1 showing an auto trip lever engaged with the circuit breaker shown in a tripped position in accordance with one illustrative embodiment of the present invention.

Referring to FIG. 2, it illustrates an isometric view of the electronic single-pole circuit breaker 5 of FIG. 1 in an upside down orientation in accordance with one illustrative embodiment of the present invention. Turning now to FIG. 3, it illustrates a side view of the single-pole circuit breaker 5 of FIG. 1 showing the auto trip lever 30 engaged with the single-pole circuit breaker 5 shown in a tripped position in accordance with one illustrative embodiment of the present invention.

In FIG. 3, the single-pole circuit breaker 5 is rotated clockwise to simulate installing the single-pole circuit breaker 5 in an electrical panel board. The auto trip lever 30 rotates in a counterclockwise direction. The auto trip lever 30 includes a guiding spring post to receive one end of the compression spring. The compression spring provides a force and a travel in an extended position to overcome a de-latching force and latch engagement between the cradle and the armature. The auto trip lever 30 includes a post feature to guide and provide a stop for a full rotation of the auto trip lever 30. The auto trip lever 30 includes a first feature to ensure that the auto trip lever 30 aligns with an inner wall of the first module 15(1) (module one). The auto trip lever 30 includes a second feature that rotates the armature counterclockwise by pushing against a feature of the armature so that a moveable arm contact and a stationary contact of the breaker mechanism 20 cannot be closed. The first module 15(1) includes a recessed mating feature to aid in a rotation alignment and a solid stop for the auto trip lever 30 when rotated in a clockwise direction.

The single-pole circuit breaker 5 comprises an electrical panel stab 300 that a breaker line terminal connects to. The single-pole circuit breaker 5 comprises a panel feature 305 that rotates the auto trip lever 30 counterclockwise as the single-pole circuit breaker 5 is installed. One end of the compression spring rests against a solid stop feature (See FIG. 5) located in the first module 15(1). An opposite end of the compression spring pushes against an auto trip lever surface 310. A feature 315 on a rear side of the single-pole circuit breaker 5 is configured to hook into the electrical panel board.

Figure 4:
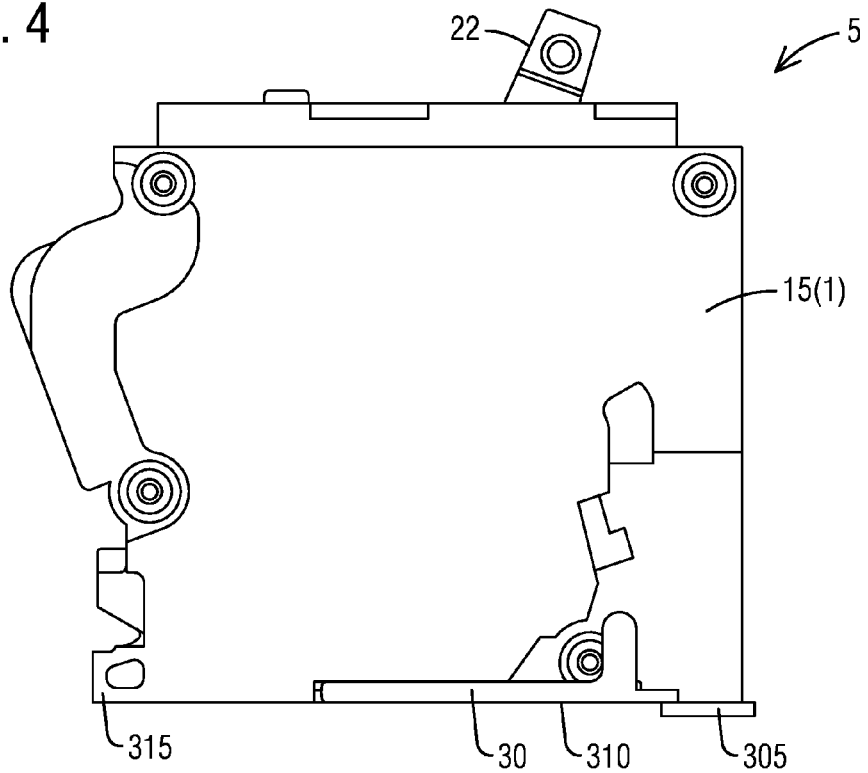
FIG. 4 illustrates a side view of the circuit breaker of FIG. 1 showing the auto trip lever disengaged with the circuit breaker shown in an ON position in accordance with one illustrative embodiment of the present invention.

FIG. 4 illustrates a side view of the single-pole circuit breaker 5 of FIG. 1 showing the auto trip lever 30 disengaged with the single-pole circuit breaker 5 shown in an ON position in accordance with one illustrative embodiment of the present invention. In FIG. 4, the single-pole circuit breaker 5 is shown installed.

Figure 5:
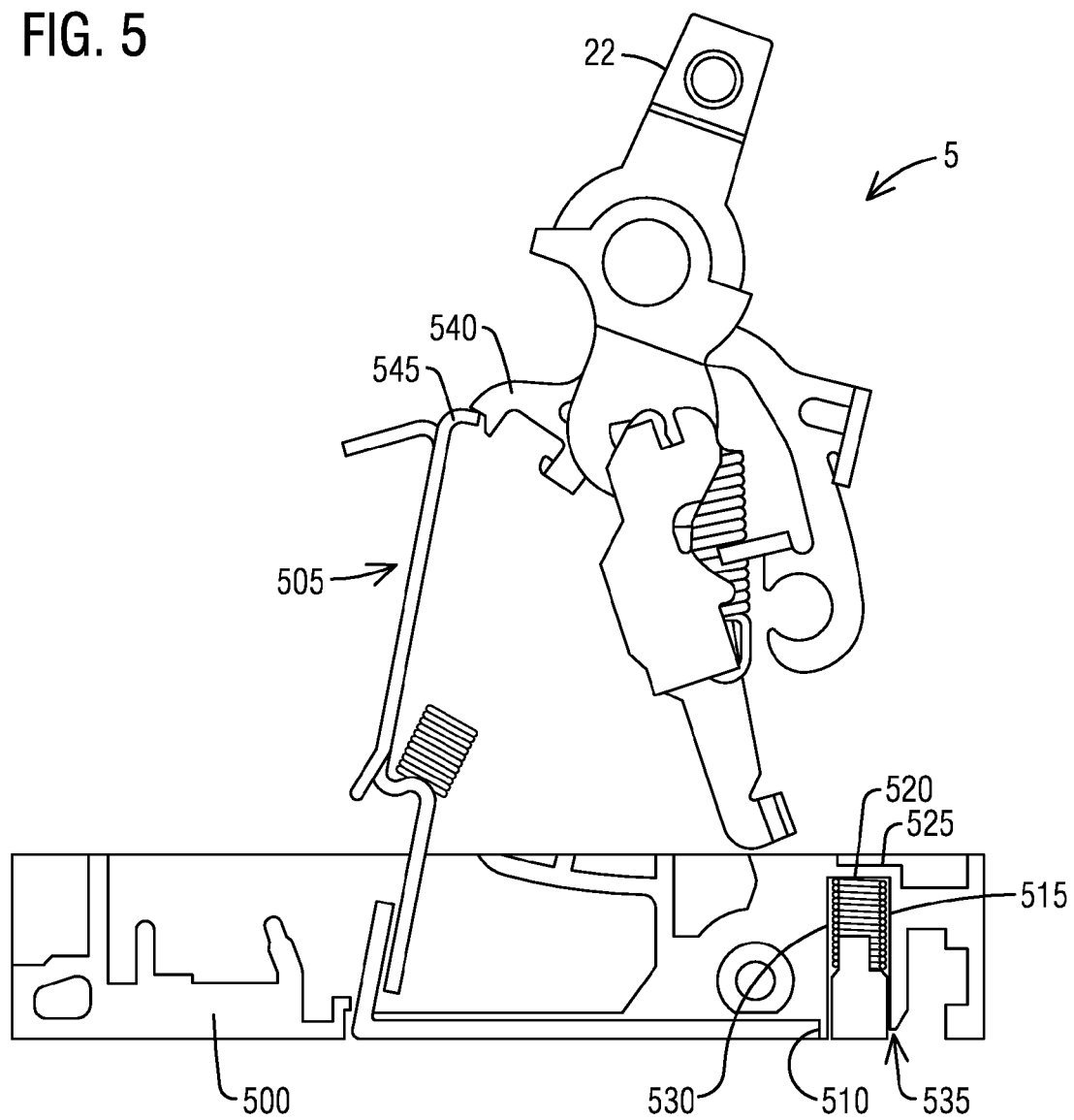
FIG. 5 illustrates a partial view of a base of the circuit breaker of FIG. 1 showing the auto trip lever disengaged with the circuit breaker shown in the ON position in accordance with one illustrative embodiment of the present invention.

As shown in FIG. 5, a partial view of a base 500 of the single-pole circuit breaker 5 of FIG. 1 shows the auto trip lever 30 disengaged with the single-pole circuit breaker 5 shown in the ON position in accordance with one illustrative embodiment of the present invention. In FIG. 5, the auto trip lever 30 interfaces with an armature 505 of the single-pole circuit breaker 5 located in the first module 15(1). The auto trip lever 30 may be made of a thermoplastic glass filled Nylon 6/6 material such as BASF A3EG6 or a mineral filled Phenolic material, for example, Durez 152.

On an opposite end 510 of the auto trip lever 30, a compression spring 515 of the auto tripping mechanism 10 in the single-pole circuit breaker 5 forces the auto trip lever 30 to rotate in a clockwise direction when the single-pole circuit breaker 5 is not installed in an electrical panel board. One end 520 of the compression spring 515 rests against a solid stop feature 525 located in the first module 15(1). The compression spring 515 is captured in the first module 15(1) with surrounding geometry acting as a guide 530 on up to four sides. This guide 530 provides a guide function as the compression spring 515 is extended and compressed during the single-pole circuit breaker 5 installation and/or removal from the electrical panel board. An opposite end 535 of the compression spring 515 pushes against the auto trip lever surface 310 (not shown). The compression spring 515 may be made of a music wire or stainless steel.

According to one embodiment, the compression spring 515 is configured to provide a force of 0.33±20% pounds minimum or up to 1.0±20% pounds and travel of 0.44±0.02 inch in the extended position to overcome the de-latching forces and latch engagement between a cradle 540 of the single-pole circuit breaker 5 and a first armature portion 545 of the armature 505. With the auto trip lever 30 rotated fully in the clockwise position, the cradle 540 and the armature 505 is unable to be latched therefore preventing the main contacts to close. The breaker handle 22 can be rotated to the ON position but will return to the tripped position when released. A set of features are used to guide and stop the auto trip lever 30 during the clockwise and counter clockwise rotations.

Figure 6:
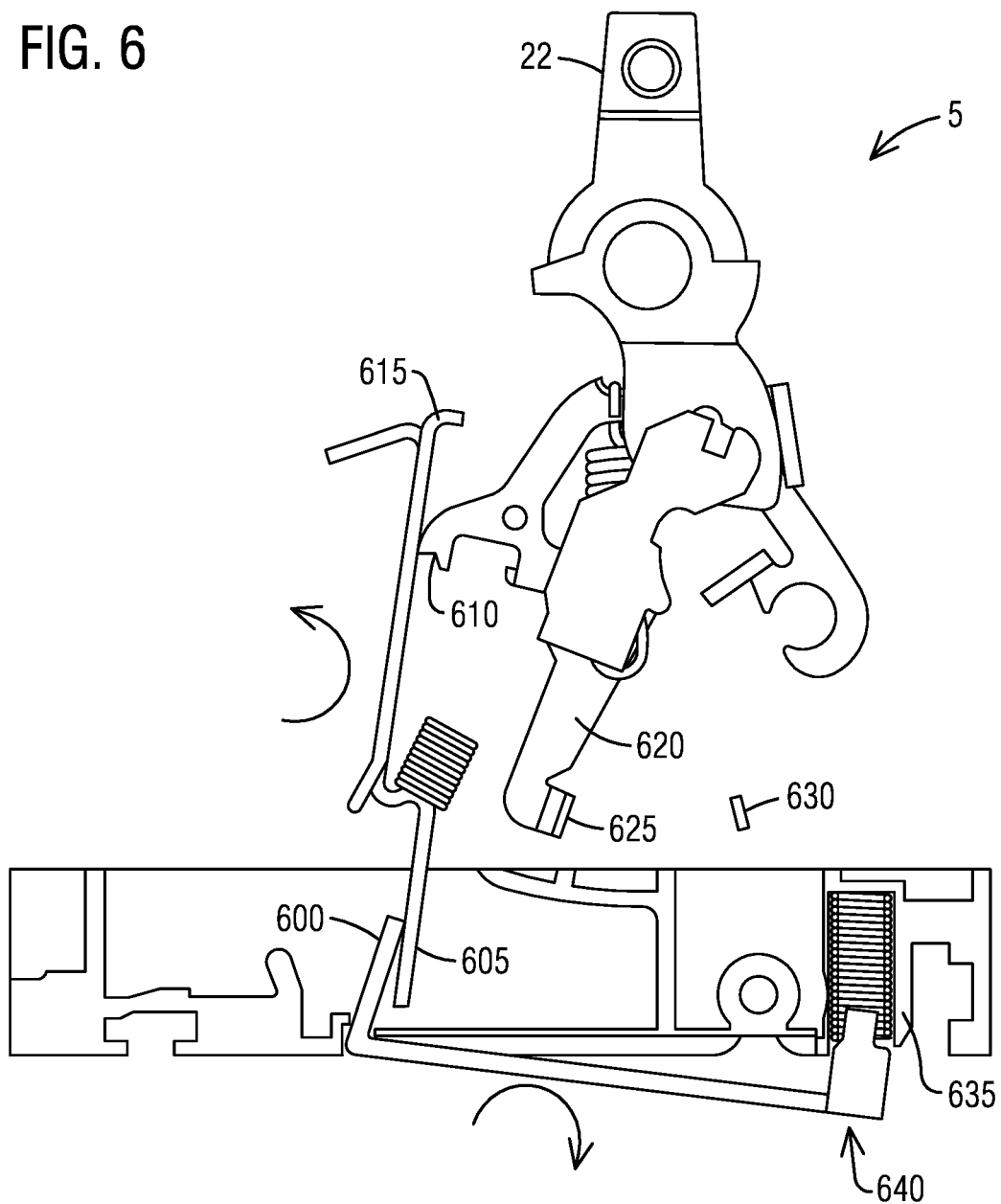
FIG. 6 illustrates a partial view of a base of the circuit breaker of FIG. 1 showing the auto trip lever engaged with the circuit breaker shown in the tripped position in accordance with one illustrative embodiment of the present invention.

As seen in FIG. 6, a partial view of the base 500 of the single-pole circuit breaker 5 of FIG. 1 shows the auto trip lever 30 engaged with the single-pole circuit breaker 5 shown in the tripped position in accordance with one illustrative embodiment of the present invention. As shown in FIG. 6, the auto trip lever 30 comprises an auto trip lever feature 600 that rotates the armature 505 counterclockwise by pushing against a second armature portion 605 of the armature 505. This rotation of the armature 505 prevents a cradle latch surface 610 and an armature latch surface 615 to overlap one another. Therefore, with no latch engagement available the moveable arm mechanism and the main contact cannot be closed. The breaker handle 22 may be rotated to the ON position but the cradle 540 and latch engagement do not overlap preventing a moveable arm 620 and a moveable contact 625 to close with a stationary contact 630.

When the single-pole circuit breaker 5 is installed in an electrical panel board and the main contacts will be opened. In other words, the moveable contact 625 will be separated from the stationary contact 630. The rear portion of the single-pole circuit breaker 5 hooks into typical features in the electrical panel board. This positions the rear portion of the single-pole circuit breaker 5 relative to the electrical panel board. The single-pole circuit breaker 5 can then be rotated clockwise to complete the installation.

As the single-pole circuit breaker 5 is rotated as shown in FIG. 3, a breaker line terminal 635 and a panel board terminal (not shown) are connected. The breaker handle 22 remains in the tripped position so there is no risk of arcing between the breaker line terminal 635 and the panel board terminal during installation. A lower portion 640 of the auto trip lever 30 comes in contact with the panel feature 305 of the electrical panel board. As the single-pole circuit breaker 5 continues to rotate into position, the auto trip lever 30 is rotated counterclockwise and goes into the lower portion of the first module 15(1), as shown in FIG. 4 and FIG. 6. This allows the armature 505 to rotate clockwise for normal operations.

Once the single-pole circuit breaker 5 is installed in the electrical panel board, the cradle 540 and the armature 505 may be latched and the breaker handle 22 turned to the ON position closing the moveable arm 620 and moveable contact 625, as shown in FIG. 5. The moveable contact 625 is now mated with the stationary contact 630. In the ON position, the auto trip lever 30 is not engaged, the movable contact 625 and the stationary contact 630 are closed and the armature 505 and the cradle 540 are latched.

To remove the single-pole circuit breaker 5 from the electrical panel board, the single-pole circuit breaker 5 is rotated counterclockwise. The lower portion 640 of the auto trip lever 30 maintains a contact with the panel feature 305 by the compression spring 515 pressing down on the auto trip lever 30. During this rotation, the auto trip lever feature 600 pushes against the second armature portion 605 of the armature 505. As the armature 505 is rotated counterclockwise, the overlap between the cradle latch surface 610 and the armature latch surface 615 begins to decrease. Once these latch surfaces have decreased enough so no longer maintain an engagement, the armature 505 and the cradle 540 disengage from one another. Once de-latched, the auto tripping mechanism 10 moves to the tripped position and the moveable contact 625 will be separate from the stationary contact 630.

As the single-pole circuit breaker 5 continues to rotate counterclockwise, the breaker line terminal 635 and the panel board terminal (not shown) are separated with no risk of arcing between the breaker line terminal 635 and the panel board terminal or terminals. In the tripped position, the auto trip lever 30 is engaged, the movable contact 625 and the stationary contact 630 are open, and the armature 505 and the cradle 540 are de-latched.

In FIG. 7, it illustrates an orthographic view of an auto trip lever pivot and the surrounding structure in accordance with one illustrative embodiment of the present invention. The first module 15(1) includes an inner wall 700 and a pair of journals 705(1-2). The auto trip lever 30 includes a pair of posts 710(1-2) that pivot within the pair of journals 705(1-2) located in the first module 15(1).

Figure 9:
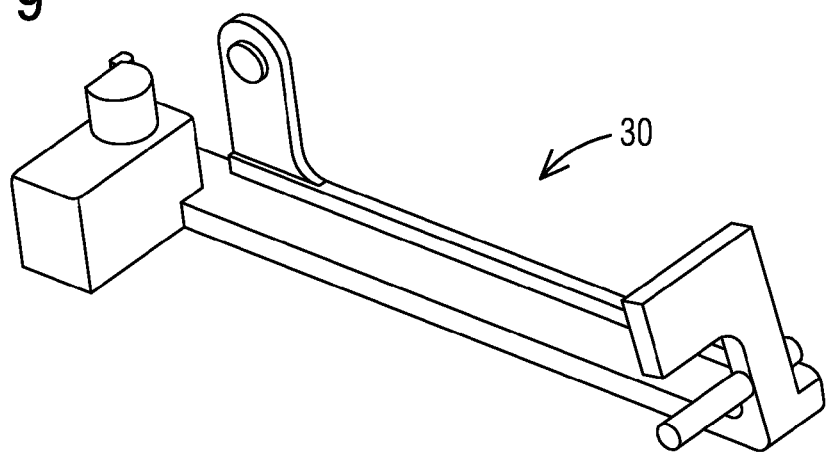

FIGS. 8-9 illustrate orthographic views of the auto trip lever 30 in accordance with one illustrative embodiment of the present invention. With regard to FIG. 8, it illustrates a perspective front view of the auto trip lever 30 in accordance with one illustrative embodiment of the present invention. With respect to FIG. 9, it illustrates a perspective back view of the auto trip lever 30 in accordance with one illustrative embodiment of the present invention.

Figure 10:
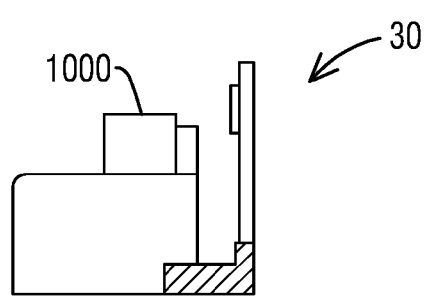
FIG. 10 illustrates a cross-sectional side view of the auto trip lever at a line A-A in FIG. 13 in accordance with one illustrative embodiment of the present invention.
Figure 13:
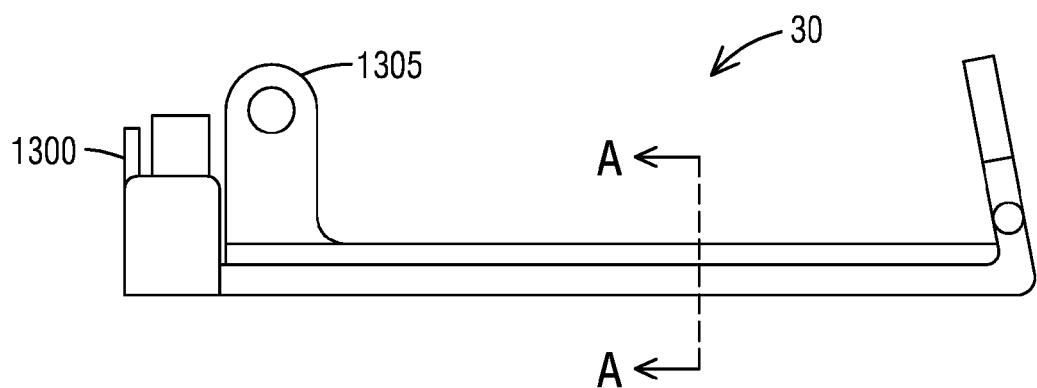
FIG. 13 illustrates a front view of the auto trip lever in accordance with one illustrative embodiment of the present invention.

FIG. 10 illustrates a cross-sectional side view of the auto trip lever 30 at a line A-A in FIG. 13 in accordance with one illustrative embodiment of the present invention. The auto trip lever 30 includes a guiding spring post 1000 to capture one end of the compression spring 515.

Figure 11:
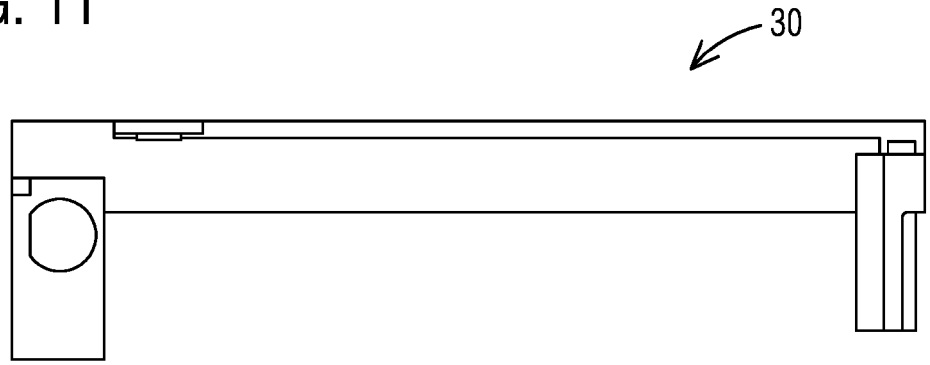
FIG. 11 illustrates a top view of the auto trip lever in accordance with one illustrative embodiment of the present invention.
Figure 12:
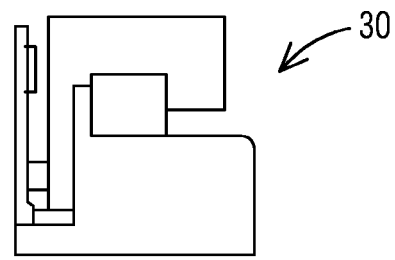
FIG. 12 illustrates other side view of the auto trip lever in accordance with one illustrative embodiment of the present invention.

FIG. 11 illustrates a top view of the auto trip lever 30 in accordance with one illustrative embodiment of the present invention. FIG. 12 illustrates other side view of the auto trip lever 30 in accordance with one illustrative embodiment of the present invention.

FIG. 13 illustrates a front view of the auto trip lever 30 in accordance with one illustrative embodiment of the present invention. A second feature 1300 of the auto trip lever 30 ensures that the auto trip lever 30 aligns with the inner wall 700 of the first module 15(1). The auto trip lever 30 includes a post feature 1305 to guide and provide a stop for the full rotation of the auto trip lever 30.

Figure 14:
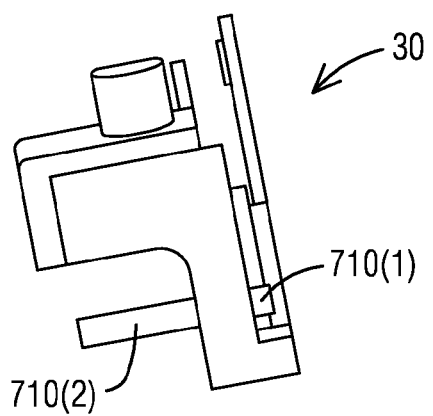
FIG. 14 illustrates a perspective side view of the auto trip lever in accordance with one illustrative embodiment of the present invention.

FIG. 14 illustrates a perspective side view of the auto trip lever 30 in accordance with one illustrative embodiment of the present invention. The auto trip lever 30 includes the pair of posts 710(1-2) for pivoting in the first module 15(1).

FIG. 15 illustrates a side view of a base 1500 of the first module 15(1) (Module one) of the circuit breaker shown in FIG. 1 in accordance with one illustrative embodiment of the present invention. The first module 15(1) includes a recessed mating feature 1505 and a solid stop 1510. The recessed mating feature 1505 is located in the first module 15(1) aids in the rotation alignment and the solid stop 1510 is for the auto trip lever 30 when rotated in a clockwise direction.

FIG. 16 illustrates a flow chart of a method 1600 of reducing arcing between a circuit breaker line terminal and an electrical panel board terminal during installation and/or removal of the single-pole circuit breaker 5 in accordance with an exemplary embodiment of the present invention. Reference is made to the elements and features described in FIGS. 1-15. It should be appreciated that some steps are not required to be performed in any particular order, and that some steps are optional.

In step 1605, the method 1600 comprises providing the auto trip lever 30 having an end. The auto trip lever 30 may be configured to interface with the armature 505 in first module 15(1) (module one) that houses the cradle 540 of the breaker mechanism 20. The method 1600 further comprises, in step 1610, preventing the breaker mechanism 20 from latching until the single-pole circuit breaker 5 has been installed in the electrical panel board by keeping the breaker handle 22 in a tripped position when the breaker line terminal 635 and the panel board terminal are connected.

The method 1600 further comprises, in step 1615, providing the spring 515 at or near the end of the auto trip lever 30. The spring 515 may be configured to force the auto trip lever 30 to rotate. The method 1600 further comprises, in step 1620, providing a force and a deflection by the spring 515 to automatically trip the single-pole circuit breaker 5 as the single-pole circuit breaker 5 is being removed from the electrical panel board and before the breaker line terminal 635 and the panel board terminal separate.

The method 1600 further comprises separating the moveable contact 625 from the stationary contact 630 when the single-pole circuit breaker 5 is installed in the electrical panel board and rotating the single-pole circuit breaker 5 clockwise to complete the installation. The method 1600 further comprises removing the single-pole circuit breaker 5 from the electrical panel board by rotating the single-pole circuit breaker 5 counterclockwise and causing the breaker mechanism 20 to move to the tripped position so that the moveable contact 625 separates from the stationary contact 630.

Embodiments of the present invention apply to single-pole circuit breakers (Mechanical pole, GFCI, or CAFCI) in that it adds a valuable safety feature. This safety feature could be included in any of GFCI or AFCI or CAFCI single-pole and/or multi-pole circuit breakers.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

Although the steps, operations, or computations may be presented in a specific order, this order may be changed in different embodiments. In some embodiments, to the extent multiple steps are shown as sequential in this specification, some combination of such steps in alternative embodiments may be performed at the same time.

Embodiments described herein can be implemented in the form of control logic in software or hardware or a combination of both. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. An apparatus, comprising:
    an auto tripping mechanism to reduce arcing between a circuit breaker having a breaker line terminal and a panel board terminal of an electrical panel board during installation and/or removal of the circuit breaker, the auto tripping mechanism including:
        an auto trip lever having an end, the auto trip lever is configured to interface with an armature in a module one that houses a cradle of a breaker mechanism, wherein the breaker mechanism is prevented from latching until the circuit breaker has been installed in the electrical panel board by keeping a breaker handle in a tripped position when the breaker line terminal and the panel board terminal are connected; and
        a spring disposed at or near the end of the auto trip lever and configured to force the auto trip lever to rotate for providing a force and a deflection to automatically trip the circuit breaker as the circuit breaker is being removed from the electrical panel board and before the breaker line terminal and the panel board terminal separate.

2. The apparatus of claim 1, wherein the module one includes a pair of journals and the auto trip lever includes a pair of posts to pivot within the pair of journals of the module one.

3. The apparatus of claim 1, wherein the module one includes a solid stop feature against which the spring rests in the module one and the module one includes a guide to enable expansion and compression movement of the spring as the spring is extended and compressed during the circuit breaker installation and/or removal from the electrical panel board.

4. The apparatus of claim 1, wherein the auto trip lever includes a guiding spring post to receive one end of the spring.

5. The apparatus of claim 1, wherein the spring provides a force and a travel in an extended position to overcome a de-latching force and latch engagement between the cradle and the armature.

6. The apparatus of claim 1, wherein the auto trip lever includes a post feature to guide and provide a stop for a full rotation of the auto trip lever.

7. The apparatus of claim 1, wherein the module one includes a recessed mating feature to aid in a rotation alignment and a solid stop for the auto trip lever when rotated in a clockwise direction.

8. The apparatus of claim 1, wherein the auto trip lever includes a first feature to ensure that the auto trip lever aligns with an inner wall of the module one.

9. The apparatus of claim 1, wherein the auto trip lever includes a second feature that rotates the armature counter-clockwise by pushing against a feature of the armature so that a moveable arm contact and a stationary contact of the breaker mechanism cannot be closed.

10. The apparatus of claim 9, wherein when the circuit breaker is installed in the electrical panel board the moveable arm contact is separated from the stationary contact and the circuit breaker is rotated clockwise to complete the installation.

11. The apparatus of claim 10, wherein to remove the circuit breaker from the electrical panel board, the circuit breaker is rotated counterclockwise as a lower portion of the auto trip lever maintains contact with an electrical panel feature by the spring pressing down on the auto trip lever and once de-latched, the breaker mechanism moves to the tripped position and the moveable arm contact separates from the stationary contact.

12. A circuit breaker, comprising:
    first and second modules, wherein the first module including:
        a breaker mechanism including: a moveable arm contact, a stationary contact, a breaker line terminal, a breaker handle, an armature, and a cradle; and
        an auto tripping mechanism to reduce arcing between the breaker line terminal and a panel board terminal of an electrical panel board during installation and/or removal of the circuit breaker, the auto tripping mechanism including:

an auto trip lever having an end, the auto trip lever is configured to interface with the armature in the first module that houses the cradle of the breaker mechanism, wherein the breaker mechanism is prevented from latching until the circuit breaker has been installed in the electrical panel board by keeping the breaker handle in a tripped position when the breaker line terminal and the panel board terminal are connected; and a spring disposed at or near the end of the auto trip lever and configured to force the auto trip lever to rotate for providing a force and a deflection to automatically trip the circuit breaker as the circuit breaker is being removed from the electrical panel board and before the breaker line terminal and the panel board terminal separate.

13. The circuit breaker of claim 12, wherein the first module includes a pair of journals and the auto trip lever includes a pair of posts to pivot within the pair of journals of the first module.

14. The circuit breaker of claim 12, wherein the first module includes a solid stop feature against which the spring rests in the first module, the first module includes a guide to enable expansion and compression movement of the spring as the spring is extended and compressed during the circuit breaker installation and/or removal from the electrical panel board and the first module includes a recessed mating feature to aid in a rotation alignment and a solid stop for the auto trip lever when rotated in a clockwise direction.

15. The circuit breaker of claim 12, wherein the auto trip lever includes a guiding spring post to receive one end of the spring and the auto trip lever includes a post feature to guide and provide a stop for a full rotation of the auto trip lever.

16. The circuit breaker of claim 12, wherein the spring provides a force and a travel in an extended position to overcome a de-latching force and latch engagement between the cradle and the armature.

17. The circuit breaker of claim 12, wherein the auto trip lever includes a first feature to ensure that the auto trip lever aligns with an inner wall of the module one.

18. The circuit breaker of claim 12, wherein the auto trip lever includes a second feature that rotates the armature counterclockwise by pushing against a feature of the armature so that a moveable arm contact and a stationary contact of the breaker mechanism cannot be closed.

19. A method of reducing arcing between a breaker line terminal and a panel board terminal of an electrical panel board during installation and/or removal of a circuit breaker, the method comprising:

providing an auto trip lever having an end, wherein the auto trip lever is configured to interface with an armature in a module one that houses a cradle of a breaker mechanism;

preventing the breaker mechanism from latching until the circuit breaker has been installed in the electrical panel board by keeping a breaker handle in a tripped position when the breaker line terminal and the panel board terminal are connected;

providing a spring at or near the end of the auto trip lever, wherein the spring is configured to force the auto trip lever to rotate; and providing a force and a deflection by the spring to automatically trip the circuit breaker as the circuit breaker is being removed from the electrical panel board and before the breaker line terminal and the panel board terminal separate.

20. The method of claim 19, further including:

separating the moveable arm contact from the stationary contact when the circuit breaker is installed in the electrical panel board and rotating the circuit breaker clockwise to complete the installation; and removing the circuit breaker from the electrical panel board by rotating the circuit breaker counterclockwise and causing the breaker mechanism to move to the tripped position so that the moveable arm contact separates from the stationary contact.

* * * * *